(12) United States Patent
Hurwitz et al.

(10) Patent No.: US 9,779,940 B2
(45) Date of Patent: *Oct. 3, 2017

(54) CHIP PACKAGE (71) Applicant: Zhuhai Advanced Chip Carriers & Electronic Substrate Solutions Technologies Co. Ltd., Zhuhai (CN)

(72) Inventors: Dror Hurwitz, Zhuhai (CN); Alex Huang, Zhuhai (CN)

(73) Assignee: Zhuahai Advanced Chip Carriers & Electronic Substrate Solutions Technologies Co. Ltd., Zhuhai (CN)

( * ) Notice: Subject to any disclaimer, the term of this patent is extended or adjusted under 35 U.S.C. 154(b) by 0 days.

This patent is subject to a terminal disclaimer.

(21) Appl. No.: 14/789,165

(22) Filed: Jul. 1, 2015

(65) Prior Publication Data

US 2017/0005057 A1 Jan. 5, 2017

(51) Int. Cl.
| | |
|---|---|
| *H01L 21/56* | (2006.01) |
| *H01L 21/027* | (2006.01) |
| *H01L 23/498* | (2006.01) |
| *H01L 21/683* | (2006.01) |
| *H01L 21/78* | (2006.01) |
| *H01L 23/00* | (2006.01) |
| *H01L 21/48* | (2006.01) |

(Continued)

(52) U.S. Cl.
CPC ...... *H01L 21/0273* (2013.01); *H01L 21/4846* (2013.01); *H01L 21/568* (2013.01); *H01L 21/6835* (2013.01); *H01L 21/78* (2013.01); *H01L 23/3135* (2013.01); *H01L 23/49827* (2013.01); *H01L 23/49838* (2013.01); *H01L 23/49861* (2013.01); *H01L 23/49866* (2013.01); *H01L 23/5389* (2013.01); *H01L 24/19* (2013.01); *H01L 24/20* (2013.01); *H01L 24/96* (2013.01); *H01L 24/97* (2013.01); *H01L 21/561* (2013.01); *H01L 21/563* (2013.01); *H01L 23/13* (2013.01); *H01L 23/142* (2013.01); *H01L 23/3114* (2013.01); *H01L 23/49548* (2013.01); *H01L 23/49586* (2013.01); *H01L 23/544* (2013.01); *H01L 2221/68372* (2013.01); *H01L 2221/68381* (2013.01); *H01L 2223/54486* (2013.01); *H01L 2224/04105* (2013.01); *H01L 2224/12105* (2013.01); *H01L 2924/14* (2013.01); *H01L 2924/181* (2013.01); *H01L 2924/37001* (2013.01)

(58) Field of Classification Search
CPC ..... H01L 21/563; H01L 23/13; H01L 23/142; H01L 23/3114; H01L 23/49548; H01L 23/49586; H01L 23/49838
USPC .......................................... 257/790
See application file for complete search history.

(56) References Cited

U.S. PATENT DOCUMENTS

| | | | |
|---|---|---|---|
| 2010/0000772 A1* | 1/2010 | Letterman, Jr. ....... | H01L 21/561 174/260 |
| 2010/0207281 A1* | 8/2010 | Su ........................ | H01L 21/563 257/786 |

(Continued)

*Primary Examiner* — George Fourson, III
(74) *Attorney, Agent, or Firm* — Wiggin and Dana LLP; Gregory S. Rosenblatt; Jonathan D. Hall (57) ABSTRACT

An embedded die package comprising a die having die contract pads in a passivation layer, the die contact pads being coupled to a first side of a feature layer by an adhesive layer, a layer of pillars extending from a second side of the feature layer, the die, feature layer and the layer of pillars being encapsulated by a dielectric material.

23 Claims, 8 Drawing Sheets

(51) Int. Cl.
*H01L 23/538* (2006.01)
*H01L 23/13* (2006.01)
*H01L 23/14* (2006.01)
*H01L 23/31* (2006.01)
*H01L 23/495* (2006.01)
*H01L 23/544* (2006.01)

(56) References Cited

U.S. PATENT DOCUMENTS

| | | | |
|---|---|---|---|
| 2012/0075807 A1* | 3/2012 | Refai-Ahmed | H01L 23/13 361/719 |
| 2012/0286408 A1* | 11/2012 | Warren | H01L 21/4832 257/673 |
| 2013/0075921 A1* | 3/2013 | Chen | H01L 23/49816 257/774 |
| 2014/0070406 A1* | 3/2014 | Mohammed | H01L 25/0652 257/737 |
| 2014/0117533 A1* | 5/2014 | Lei | H01L 24/03 257/737 |
| 2014/0134796 A1* | 5/2014 | Kelly | H01L 25/0655 438/107 |
| 2015/0021751 A1* | 1/2015 | Paek | H01L 23/49582 257/676 |
| 2015/0228561 A1* | 8/2015 | Lin | H01L 23/49541 257/676 |
| 2016/0064310 A1* | 3/2016 | Sirinorakul | H01L 23/49541 257/676 |
| 2016/0064315 A1* | 3/2016 | Wu | H01L 24/81 361/783 |
| 2016/0066414 A1* | 3/2016 | Jow | H01L 23/49838 361/767 |

* cited by examiner

CHIP PACKAGE

BACKGROUND

Field of the Invention

The present invention relates to electronic chip packaging and to methods of manufacturing of same.

Description of the Related Art

Consumer electronics such as computing and telecommunication devices include integrated circuit chips.

The classical approach for enabling the coupling of chips to the outside world is to include an IC substrate as part of the chip packaging. The packaged chip has connections such as a ball grid array BGA or a land grid array LGA for coupling to a printed circuit board PCB or other substrate to which other components are coupled.

The IC substrate is required to have high planarity and to be stiff and warp resistant to ensure good contact with PCBs and other underlying substrates. The general requirement for IC substrates in particular and for chip packaging in general is reliability and appropriate electrical performance, thinness, stiffness, planarity, good heat dissipation and a competitive unit price.

A well established common type of chip package that is comparatively cheap and enables IC circuits to communicate with the outside world is the lead frame. The lead frame uses metal leads that extend outside the housing. Lead frame technology goes back to the early days of DIP chips, but is still widely used in many package varieties.

The lead frame serves as the 'skeleton' of the IC package, providing mechanical support to the die during its assembly into a finished product. It consists of a die paddle, to which the die is attached, and leads, which serve as the means for external electrical connection to the outside world. The die is connected to the leads by wires through wire bonding or by tape automated bonds.

Once attached to the lead frame with the connecting wires, the die or chip is covered with a plastic protective material that is known as a molding compound.

Technologies that are used for fabricating more advanced multilayer substrates comprise layers of connecting pads or features embedded within dielectric material. Vias are provided through the dielectric material to electronically couple together features in different layers.

One method for fabricating such vias is by drill & fill, wherein holes are drilled through the dielectric, typically using a laser, and a conductive material, such as copper is used to fill the hole, creating a via.

An alternative approach to fabricate vias is by depositing copper or other metal into a pattern created in a photo-resist by selective exposure to light of an appropriate wavelength, typically ultraviolet, either by selective exposure to a lamp through a stencil or by writing the pattern using a laser scribe. This technology of electroplating into a pattern developed into a photo-resist is known as 'pattern plating'. The photo-resist is subsequently removed and the upstanding via posts are laminated with a dielectric material that is preferably a polymer impregnated glass fiber mat pre-preg for enhanced stiffness.

In pattern plating, a seed layer is first deposited. Then a layer of photo-resist is deposited thereover and subsequently exposed to create a pattern which is selectively removed to make trenches that expose the seed layer. Via posts are created by depositing copper into the trenches in the photo-resist. The remaining photo-resist is then removed, the seed layer is etched away, and a dielectric material that is, again, typically a polymer impregnated glass fiber mat prepreg, is laminated thereover and therearound to encase the vias posts. Various techniques and processes can be then use to thin down the dielectric material, planarizing it and exposing the tops of the via posts allowing conductive connection to a ground or reference plane thereby, for building up the next metal layer thereupon. Subsequent layers of metal conductors and via posts may be deposited thereonto, by repeating the process to build up a desired multilayer structure.

In an alternative but closely linked technology, known hereinafter as 'panel plating', a continuous layer of metal or alloy is deposited onto a substrate. A layer of photo-resist is deposited on top of this and a pattern is developed within the photo-resist. Subsequently the developed photo-resist is selectively stripped away, selectively exposing the metal thereunder, which may then be etched away. The undeveloped photo-resist protects the underlying metal from being etched away, and leaves a pattern of upstanding features and vias. After stripping away the undeveloped photo-resist, a dielectric material, such as a polymer impregnated glass fiber mat, may be laminated around and over the upstanding copper features and/or via posts. In yet other variants, a pattern of undeveloped photoresist is stripped away leaving the developed photoresist to act as a mask.

The via layers created by pattern plating or panel plating methodologies such as those described above, are typically known as 'via posts'. Feature layers may be fabricated using similar techniques.

One flexible technology for fabricating high density interconnects is to build up pattern or panel plated multilayer structures consisting of metal vias or features in a dielectric matrix. The metal used for the vias and features may be copper, and the dielectric may consist of a fiber reinforced polymer matrix. Typically, a polymer with a high glass transition temperature ($T_g$) is used, such as polyimide, for example. These interconnects may be cored or coreless, and may include cavities for stacking components. They may have odd or even numbers of layers. Enabling technology is described in previous patents issued to Amitec-Advanced Multilayer Interconnect Technologies Ltd. For example, U.S. Pat. No. 7,682,972 to Hurwitz et al. titled "Advanced Multilayer Coreless Support Structures and Method for their Fabrication" describes a method of fabricating a free standing membrane including a via array in a dielectric, for use as a precursor in the construction of superior electronic support structures. The method includes the steps of fabricating a membrane of conductive vias in a dielectric surround on a sacrificial carrier, and detaching the membrane from the sacrificial carrier to form a free standing laminated array. An electronic substrate based on such a free standing membrane may be formed by thinning and planarizing the laminated array, followed by terminating the vias. This publication is incorporated herein by reference in its entirety.

U.S. Pat. No. 7,635,641 to Hurwitz et al. titled "Integrated Circuit Support Structures and their Fabrication" describes a method of fabricating an electronic substrate comprising the steps of; (A) selecting a first base layer; (B) depositing a first etchant resistant barrier layer onto the first base layer; (C) building up a first half stack of alternating conductive layers and insulating layers, the conductive layers being interconnected by vias through the insulating layers; (D) applying a second base layer onto the first half stack; (E) applying a protective coating of photo-resist to the second base layer; (F) etching away the first base layer; (G) removing the protective coating of photo-resist; (H) removing the first etchant resistant barrier layer; (I) building up a second half stack of alternating conductive layers and insulating layers, the conductive layers being interconnected by vias through the insulating layers, wherein the second half stack has a substantially symmetrical lay up to the first half stack; (J) applying an insulating layer onto the second half stack of alternating conductive layers and insulating layers, (K) removing the second base layer, and (L) terminating the substrate by exposing ends of vias on outer surfaces of the stack and applying terminations thereto. This publication is incorporated herein by reference in its entirety.

Multilayer substrates enable a higher density of connections and are used with ever more sophisticated IC chips. They are more expensive than simple single layer lead frames, and for many electronic applications, the more economical lead frame is suitable.

Even for packaging relatively simple chips where a single later is adequate, lead frame technology has its limitations. The chip is attached to the lead frame by wire bonding and the longer the connecting wires, the greater the danger of a wire breaking, creating a disconnect and leading to failure. Additionally, the closer the wires are packed together, the greater the likelihood of shorting.

The via post in dielectric material approach is suitable for multilayer substrates but is generally too flimsy to be used in single layers, since it will be appreciated that warping and bending create poor contacts, unreliability and shorting.

U.S. Pat. No. 8,866,286 to Hurwitz et al. titled "Single Layer Coreless Substrate" describes an electronic chip package comprising at least one chip bonded to a routing layer of an interposer comprising a routing layer and a via post layer, wherein the via post layer is surrounded by a dielectric material comprising glass fibers in a polymer resin, and the chip and routing layer are embedded in a second layer of dielectric material encapsulating the chip and the routing layers. In this packaging technology, the copper ends of the via posts are flush with the dielectric material.

The package is fairly robust but may be subject to over-heating. Additionally, such packages may have stray inductances due to the wire bonds and may be costly to manufacture due to the assembly processes and materials required for the die-attachment, the wire-bonding and molding.

There is still a need for thin, reliable and low cost chip packages and embodiments of the present invention address this need.

SUMMARY

Embodiments of the present invention are directed to providing novel chip packaging solutions.

A first aspect is directed to an embedded die package comprising a die having die contract pads in a passivation layer, the die contact pads being coupled to a first side of a feature layer by an adhesion/barrier layer, pillars extending from a second side of the feature layer, the die, feature layer and pillars being encapsulated by a dielectric material.

Typically, the die contact pads comprise aluminum.

Typically, the passivation layer comprises either PI or SiN.

Generally, the adhesion/barrier layer is selected from the group consisting of Ti/Cu, Ti/W/Cu Ti/Ta/Cu, Cr/Cu, Ni/Cu and Cr/Ni/Cu.

Typically, the adhesion layer has a thickness in the range of from 0.05 microns to 1 microns.

Typically, the feature layer comprises copper.

Typically, the feature layer has a thickness in the range of from 1 micron to 25 micron.

In some embodiments, the feature layer has a fan-out form.

In some embodiments, the feature layer has a fan-in form.

In some embodiments, the chip and the pillars are embedded in different polymer dielectric materials.

In some embodiments, the layer of pillars provides a grid array of pads that serve as contacts for coupling the die to a substrate.

Optionally, the substrate is a PCB.

Optionally, the substrate is a Package for fabricating a Package on Package.

Typically, the grid array of pads are terminated in accordance with industry standards.

In some embodiments, the grid array of pillars extends up to 10 microns beyond the dielectric or are flush with the dielectric thereby providing LGA pads.

Optionally the grid array of pillars are terminated with a termination selected from the group consisting of Ni/Au, ENIG or ENEIG.

In some embodiments, the grid array of pillars is recessed below the dielectric by up to 10 microns, or are flush with the dielectric, thereby providing BGA pads.

In some embodiments, the grid array of posts are terminated with an Organic Solder Preservative—OSP.

A second aspect is directed to a method of fabricating the novel chip packages described herein comprising:
Obtaining a grid of sockets surrounded by a polymer frame;
Placing the grid of chip sockets on a tape;
Placing chips face down (flip chip) in the sockets of the grid;
Laminate a dielectric material over the dies and the grid;
Apply a carrier over the dielectric;
Deposit an adhesion/barrier layer comprising at least one of titanium, tantalum, tungsten, chrome and/or nickel followed by a seed layer of copper onto newly exposed surface;
Apply a layer of first layer of photoresist and develop a pattern with a feature layer;
Electroplate copper into the pattern to form features;
Strip away the first layer of photoresist;
Apply a second layer of photoresist patterned with a pattern of via pillars;
Electroplate copper into the pattern to form via pillars;
Strip away the second layer of photoresist;
Etch away exposed portions of the adhesive layer and the copper seed layer;
Apply a dielectric barrier layer covering the copper features, pillars and undersides of the chips;
Remove carrier;
Laminate a thin layer of black dielectric over the back of the array of dies;
Thin the dielectric to expose the copper pillars;
Apply terminations, and
Dice the grid into individual packaged chips.

Optionally, an array of chips is positioned within each socket.

In a variant manufacturing route, a wafer with an array of chips thereon is positioned within each socket.

In some embodiments, the copper pillars comprise a LGA (Land Grid Array) and are characterized by at least one of the following limitations:
Square or rectangular shape;
Outer surface being plated with a final metal plating comprising Electroless Nickel/Electroless Palladium/Immersion Gold (ENEPIG) or Electroless Nickel/Immersion Gold (ENIG) or Electrolytic Nickel and Gold (Ni/Au) termination techniques, and Optionally protruding by up to 10 microns from the surrounding dielectric.

In some embodiments, the copper pillars comprise a BGA (Ball Grid Array) of pads characterized by at least one of:
Being recessed by up to 10 microns with respect to surrounding dielectric;
Having cylindrical shape with circular ends for ease of wetting by solder, and
Being coated with OSP (Organic Solderability Preservative).

Typically, the black dielectric is then marked with a laser.

BRIEF DESCRIPTION OF THE DRAWINGS

For a better understanding of the invention and to show how it may be carried into effect, reference will now be made, purely by way of example, to the accompanying drawings.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention; the description taken with the drawings making apparent to those skilled in the art how the several forms of the invention may be embodied in practice. In the accompanying drawings.

Like reference numbers and designations in the various drawings indicated like elements.

The term micron means $1 \times 10^{-6}$ of a meter, and may be annotated "µm".

DETAILED DESCRIPTION

In the description hereinbelow, support structures consisting of metal vias in a dielectric matrix, particularly, copper via posts in a polymer matrix, such as polyimide, epoxy or BT (Bismaleimide/Triazine), Polyphenylene Ether (PPE), Polyphenylene Oxide (PPO) or their blends, reinforced with glass fibers are considered.

Figure 1:
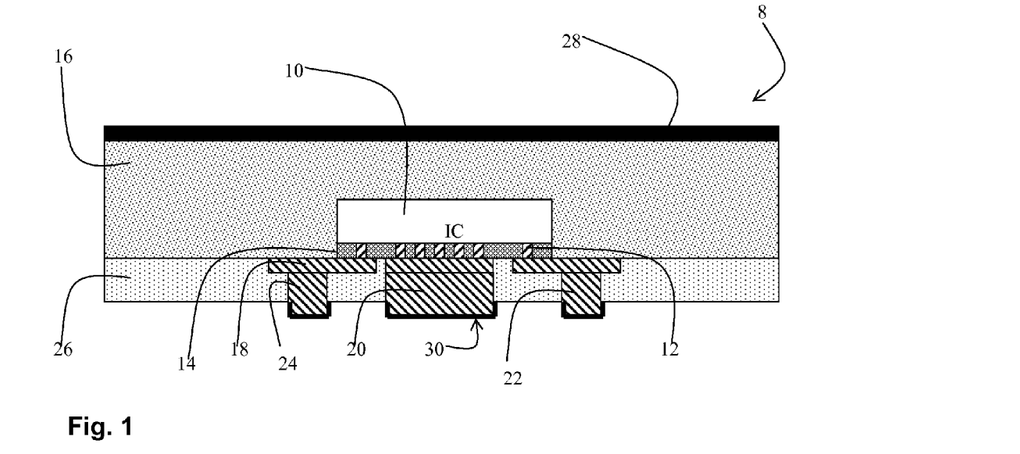
FIG. 1 is a simplified section through an electronic chip package in accordance with one embodiment that enables coupling a packaged chip to a substrate by a Land Grid Array (LGA)

With reference to FIG. 1, a simplified section through an electronic chip package 8 in accordance with one embodiment that enables coupling a chip 10 to a substrate by a Land Grid Array (LGA) 20, 22, 24 is shown.

The electronic chip package 8 consists of a die or chip 10 with aluminum pillars 12 in a passivation layer 14 comprises either PI or SiN.

The chip 10 with aluminum pillars 12 in a passivation layer 14 is encapsulated by laminating with a first dielectric material 16 having a polymer matrix such as polyimide, epoxy or BT (Bismaleimide/Triazine), Polyphenylene Ether (PPE), Polyphenylene Oxide (PPO) or their blends, either provided as a film, or as a pre-preg reinforced with glass fibers for additional stiffness.

Pads 18 are coupled to the aluminum pillars 12.

A layer of copper pillars 20, 22, 24 is fabricated on the opposite side of the pads 18 from that on which the IC 10 is positioned.

Usefully the pads 18 fan out and one or more of these pillars 22, 24 are positioned beyond the perimeter of the IC chip 10, in what is commonly referred to as a fan-out configuration for ease of coupling to a substrate such as a PCB having contacts on a coarser scale One of more of these pillars 20 may be a large pillar beneath the chip that in addition to providing electrical connection to selected pillars 12 and possibly connecting several such pillars 12 together and maybe to ground, also serves as a heat sink, drawing heat away from the chip 10 and allowing it to dissipate over a large volume, it being noted that the dielectric materials 16, 26 are generally good heat insulators, i.e. poor heat conductors, and flip chip configurations may suffer from over heating causing data corruption or noise.

Instead of a fan-out configuration, it will be appreciated that the technology may provide a fan-in configuration if desired. Furthermore, where the processing is of several chips 'on wafer', before segmenting, rather than of individual chips, fan out configurations are generally not possible.

The pads 18 and pillars 20, 22, 24 may be encapsulated in a dielectric material 26 which may be a different dielectric material from the dielectric 16 that encapsulates the chip 10. A thin layer of black dielectric 28 may be laminated over the top of the die package 8 to aid laser marking visibility. The layer of black dielectric 28 may be provided as a prepreg or as a polymer film.

For coupling to substrates such as printed circuit boards (PCBs) with a Land Grid Array (LGA), the columns 20, 22, 24 are often square or rectangular, but may, nevertheless, have other shapes, and may be round for example.

For ease of attachment to the substrate, the ends of the columns 20, 22, 24 may protrude by up to 10 microns beyond the dielectric. The exposed ends of the columns 20, 22, 24 will typically be coated with a final metal plating 30 on their external surface comprising Electrolytic Ni/Au sometimes known as Electroless Nickel Immersion Gold, or of Ni/Pd/Au, where there is a layer of palladium on the nickel and under the gold, in a process known as ENEPIG.

Figure 2:
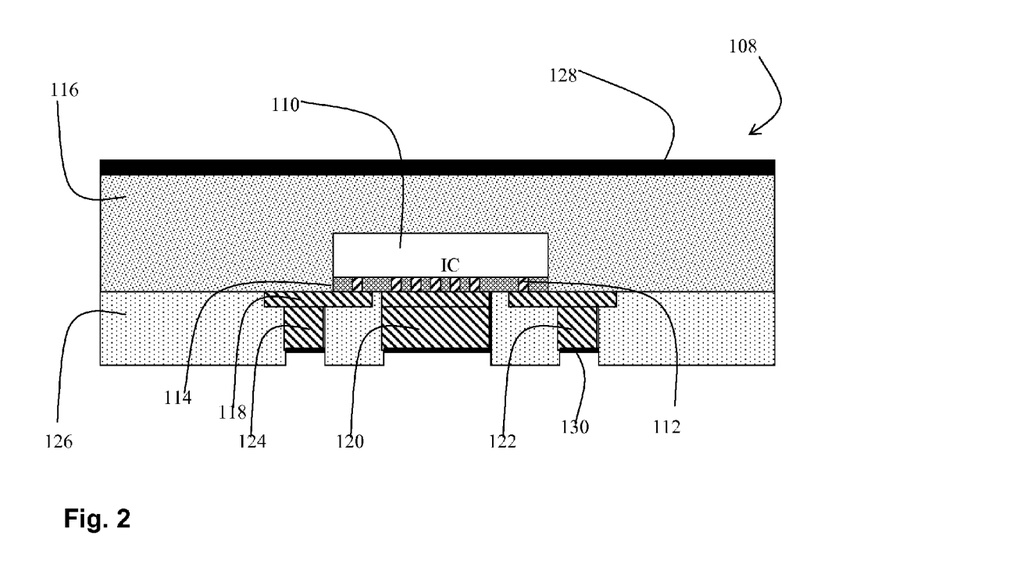
FIG. 2 is a simplified section through an electronic chip package in accordance with one embodiment that enables coupling a packaged chip to a substrate by a Ball Grid Array (BGA)

Referring to FIG. 2, a second a simplified section through an electronic chip package 108 in accordance with one embodiment that enables coupling a chip 110 to a substrate by a Ball Grid Array (BGA) 120, 122, 124 is shown.

The electronic chip package 108 consists of a die or chip 110 with aluminum pillars 112 in a passivation layer 114 comprises either PI or SiN.

The chip 110 with aluminum pillars 112 in a passivation layer 114 is encapsulated by laminating with a first dielectric material 116 having a polymer matrix such as polyimide, epoxy or BT (Bismaleimide/Triazine), Polyphenylene Ether (PPE), Polyphenylene Oxide (PPO) or their blends, either provided as a film, or as a pre-preg reinforced with glass fibers for additional stiffness.

Pads 118 are coupled to the aluminum pillars 112.

A layer of copper pillars 120, 122, 124 is fabricated on the opposite side of the pads 118 from that on which the IC 110 is positioned.

Usefully the pads 118 fan out and one or more of these pillars 122, 124 are positioned beyond the perimeter of the IC chip 110, in what is commonly referred to as a fan-out configuration for ease of coupling to a substrate such as a PCB having contacts on a coarser scale. One of more of these pillars 120 may be a large pillar beneath the chip that in addition to providing electrical connection to selected pillars 112 and possibly connecting several such pillars 112 together and maybe to ground, also serves as a heat sink, drawing heat away from the chip 110 and allowing it to dissipate over a large volume, it being noted that the dielectric materials 116, 126 are generally good heat insulators, i.e. poor heat conductors, and the flip chip configurations may suffer from over heating causing data corruption or noise.

Instead of a fan-out configuration, it will be appreciated that the technology may provide a fan-in configuration if desired. Where several chips are packaged and terminated on a wafer prior to segmentation, the fan-out configuration is generally not possible.

The pads 118 and pillars 120, 122, 124 may be encapsulated in a dielectric material 126 which may be a different dielectric material from the dielectric 116 that encapsulates the chip 110. A thin layer of black dielectric 128 may be laminated over the top of the die package 108 to aid laser marking visibility. The layer of black dielectric 128 may be provided as a prepreg or as a polymer film.

For coupling to substrates such as printed circuit boards (PCBs) with a Ball Grid Array (BGA), where a ball of solder is attached to the end of the columns and spreads out therefrom into a semispherical cap, the columns 120, 122, 124 are typically cylindrical with round cross-sections for easy wetting by the solder balls, but the columns 120, 122, 124 may, nevertheless, have other shapes, and may be elliptical, square or rectangular for example.

Unlike the protruding ends of the columns 20, 22, 25 of FIG. 1, for BGAs, typically the ends of the columns 120, 122, 124 are countersunk into the dielectric 126 which extends up to 10 microns beyond the ends of the columns 120, 122, 124 and helps with containing the solder ball to be subsequently applied upon package completion. To prevent tarnishing prior to application of the Ball Grid Array (BGA) of solder balls, the ends of the columns 120, 122, 124 will typically be coated with a final layer of Organic Solderability Preservative (OSP) 130.

Additionally, it should be noted that both copper posts serving as LGA and BGA pads in the packages described in FIG. 1 and FIG. 2 respectively, contain post structures that are typically at least 200 microns in width (or diameter) and typically 15 micron to 50 micron in thickness. The dimensions of the copper posts can further assist in reducing the DC resistance to currents entering or exiting the chip—thereby increasing the functional range of the chip and the overall package reliability—especially for high power die applications.

Figure 3:
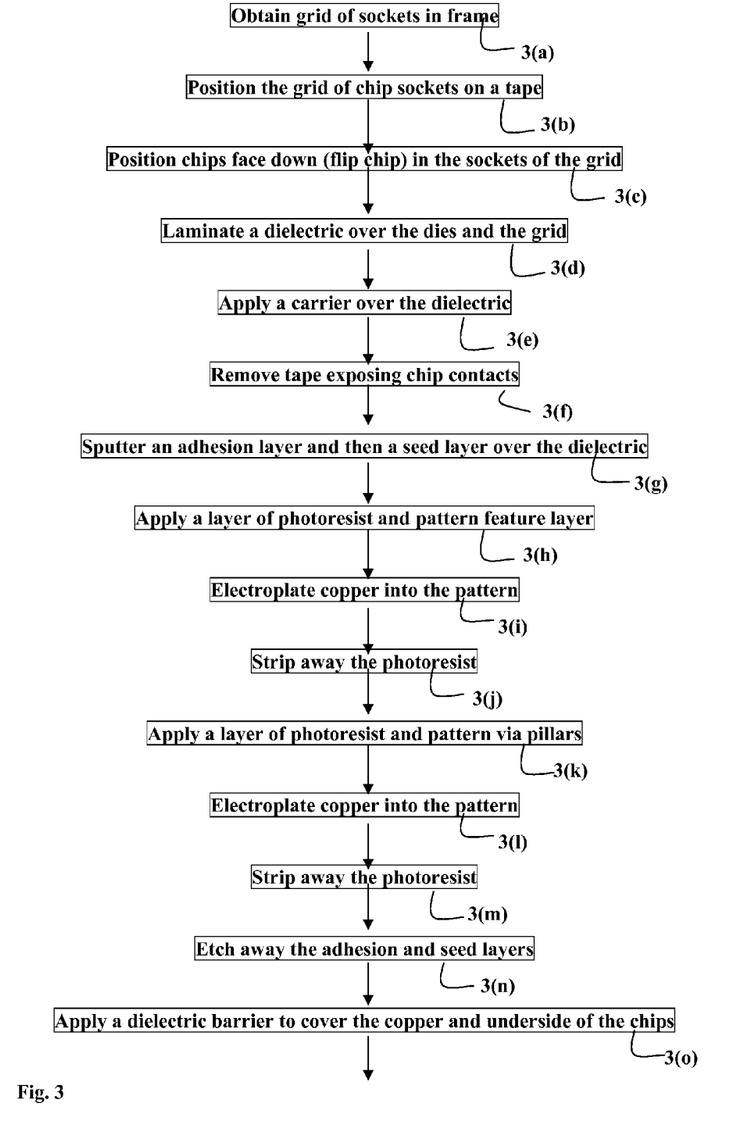
FIG. 3 is a flowchart showing how an electronic chip package of FIG. 1 may be fabricated.
Figure 3A:
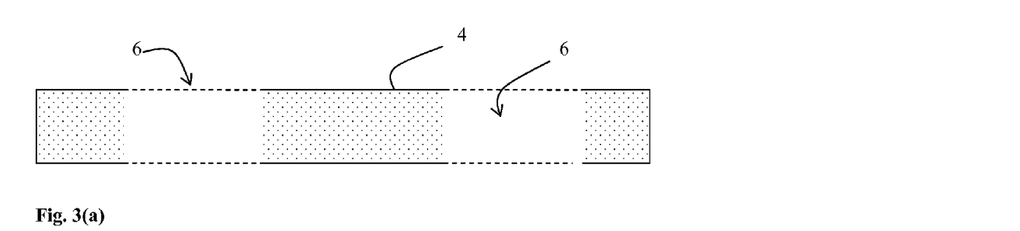
FIGS. 3(a) to 3(u) are accompanying side view sketches of intermediate structures corresponding with the steps of the flowchart of FIG. 3.
Figure 3B:
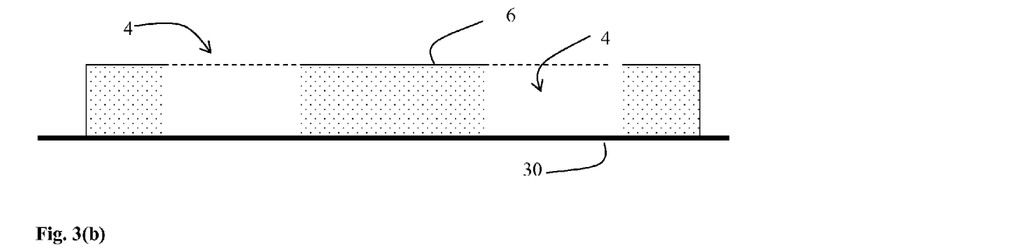
Figure 3C:
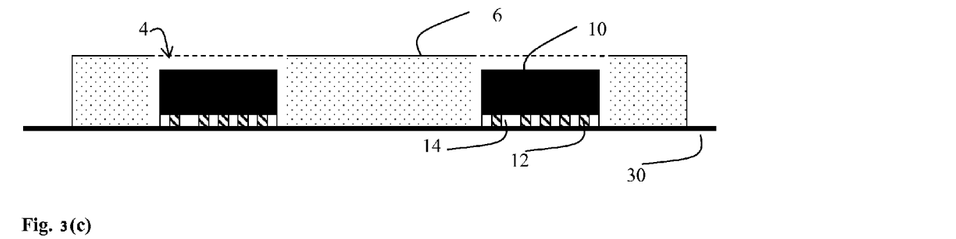
Figure 3D:
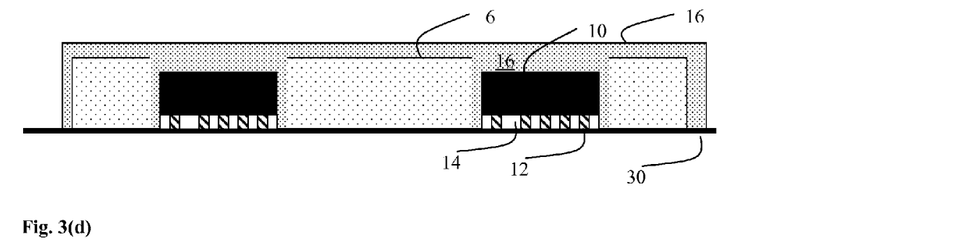
Figure 3E:
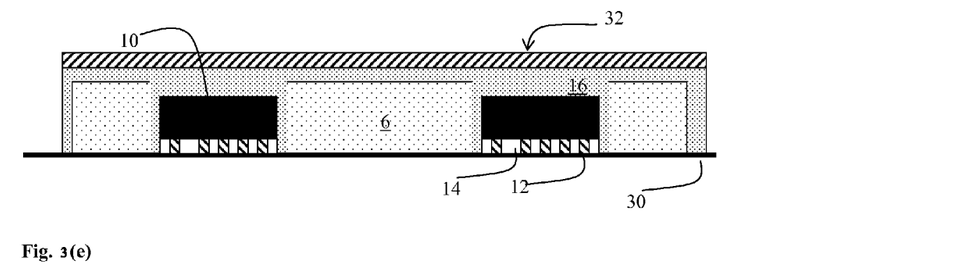
Figure 3F:
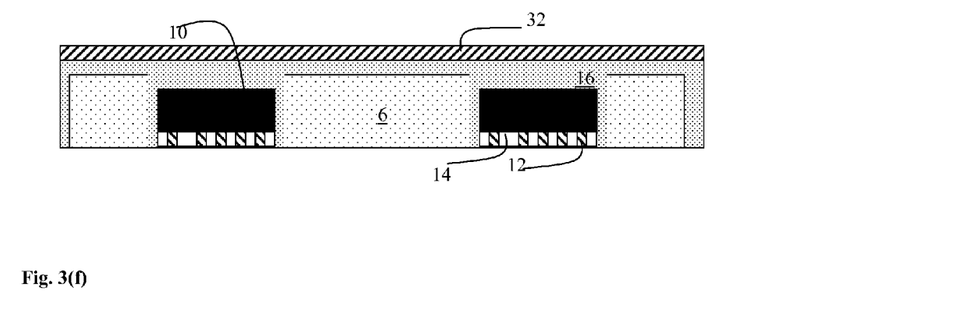
Figure 3G:
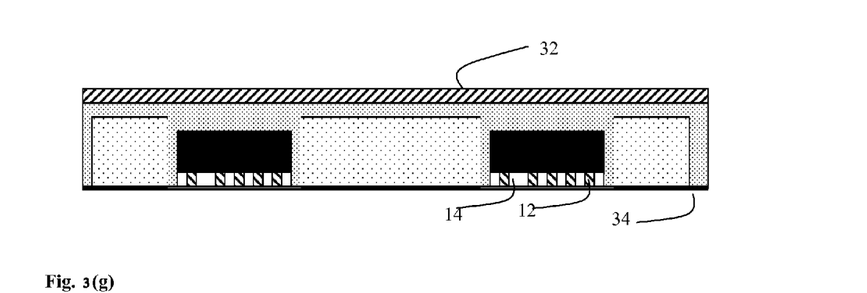
Figure 3H:
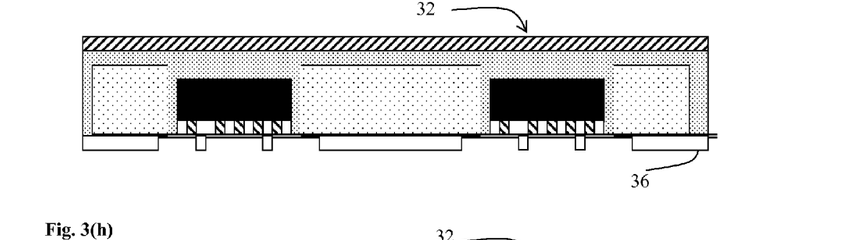
Figure 3I:
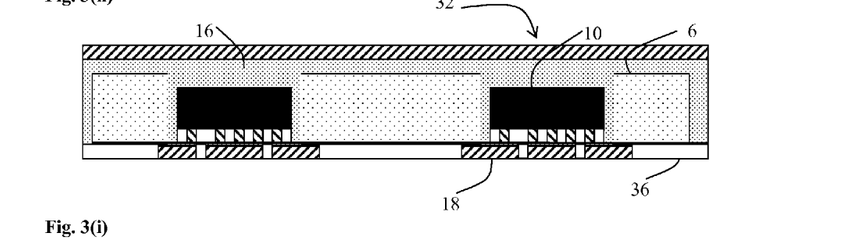
Figure 3J:
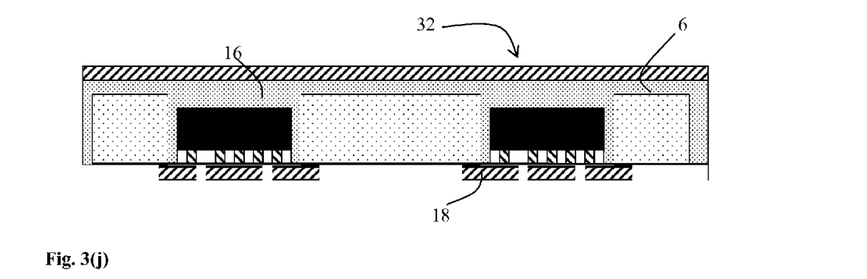
Figure 3K:
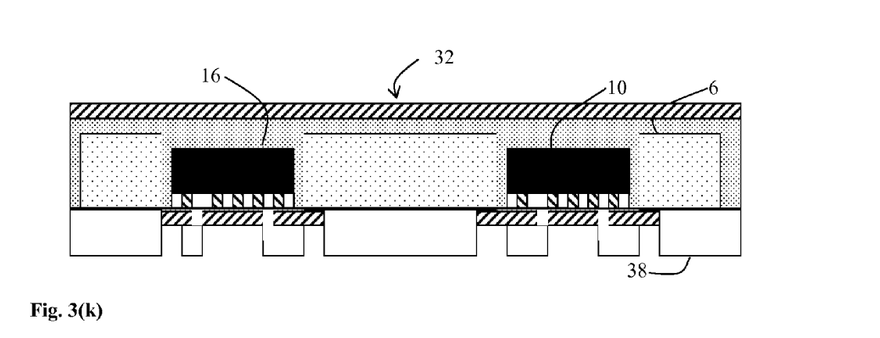
Figure 3L:
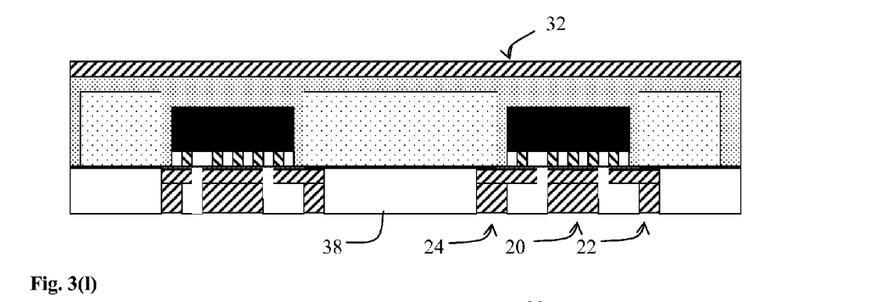
Figure 3M:
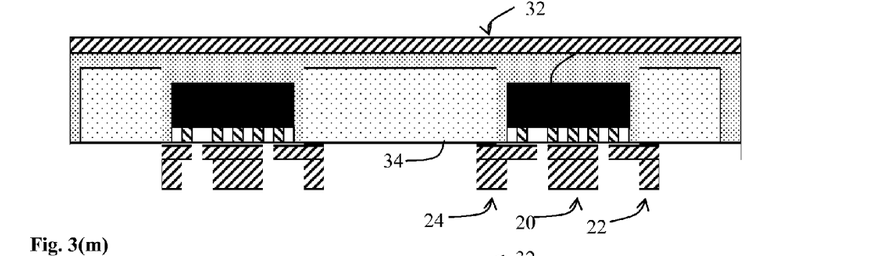
Figure 3N:
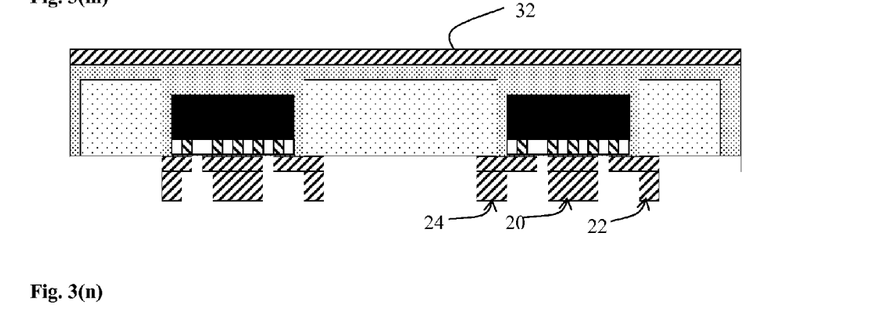
Figure 3O:
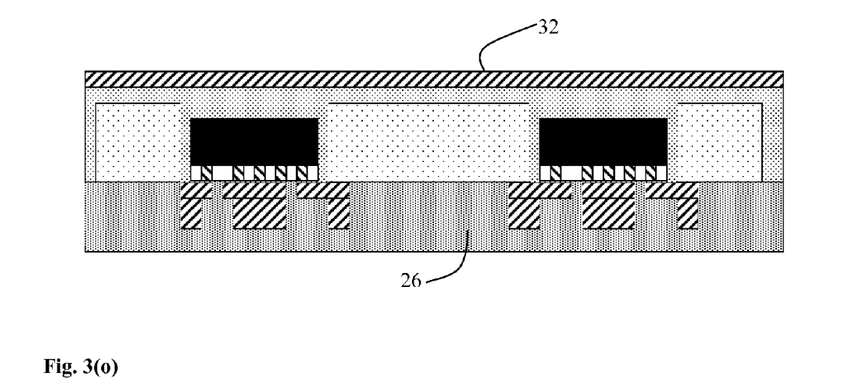
Figure 3P:
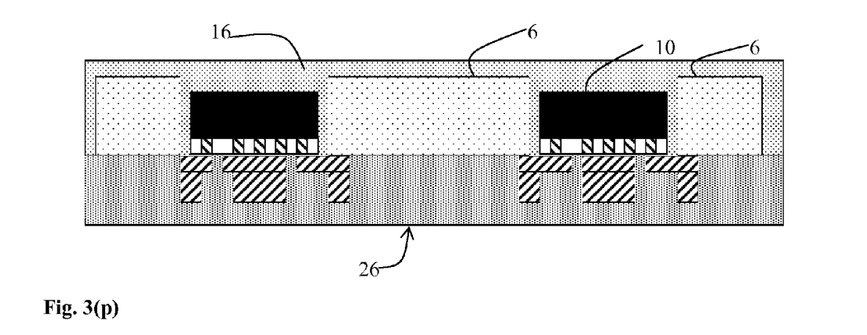
Figure 3Q:
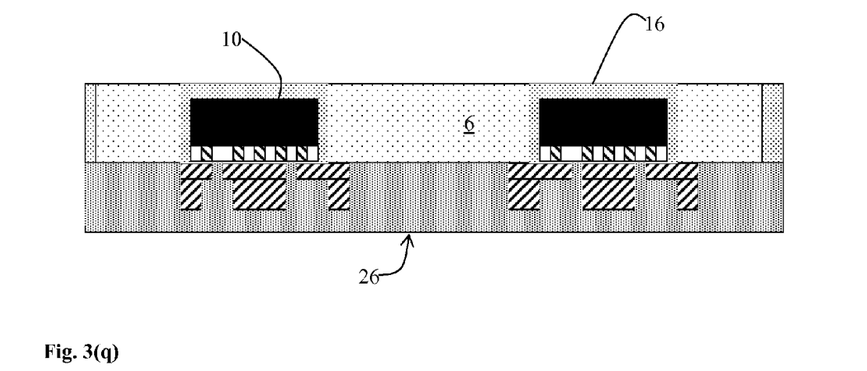
Figure 3R:
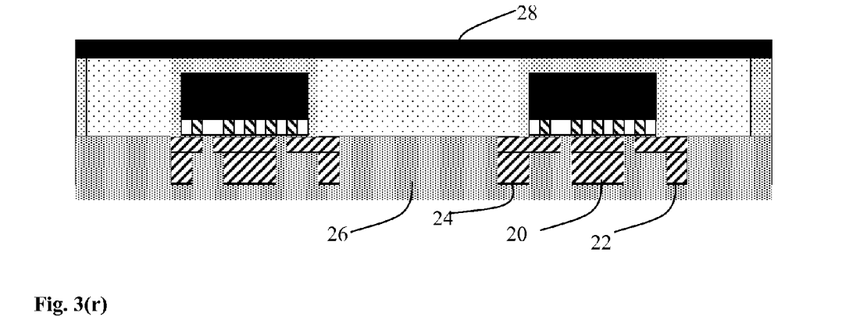
Figure 3S:
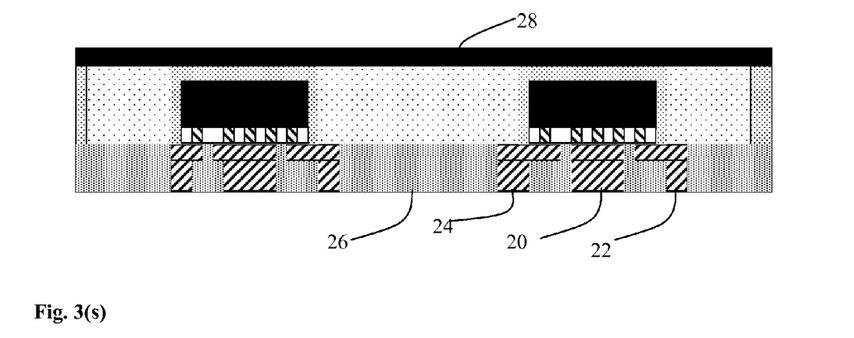
Figure 3T:
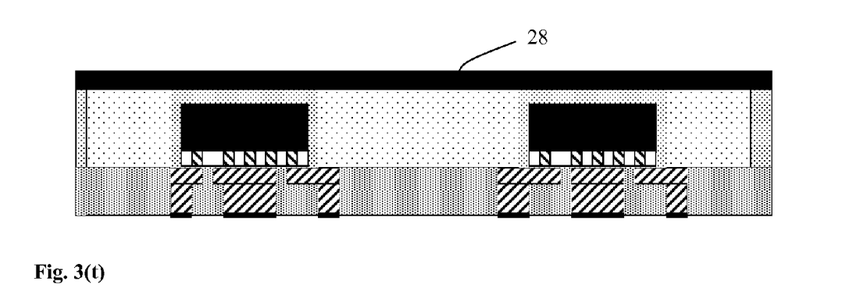
Figure 3U:
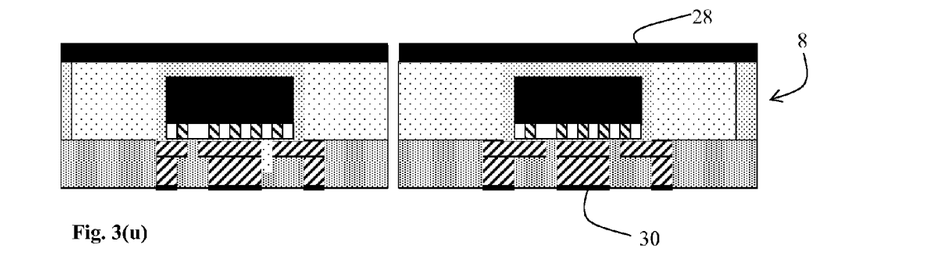

With reference to the flowchart of FIG. 3 and to FIGS. 3(a) to 3(u) showing schematic side views of a section of an array of sockets 6 in a polymer frame 4 and the embedding and connecting of a chip 10 therein, a method of fabricating the structures of FIGS. 1 and 2 is now explained in some detail.

First a grid of sockets 6 surrounded by a polymer frame 4 is procured—step 3(a). FIG. 3(a) shows a couple of adjacent sockets. The following description shows and describes processing a couple of individual chips picked and placed in single chip sockets. In practice, a large two dimensional array of sockets may be processed together.

Furthermore, in a variant process, a single socket could be used for processing a wafer with a grid of chips thereupon, that may subsequently be segmented.

The frame 6 may consist of a polymer applied as a polymer sheet, or may be a glass fiber reinforced polymer, applied as a prepreg. It may have one or more layers. The through-thickness sockets 4 may be punched out, or the frame 6 may be fabricated over sacrificial copper stubs that are subsequently dissolved to provide the through-thickness sockets 4.

Zhuhai Access' panels may be 21"×25", and a packaged chip may be 5 mm×5 mm. Consequently this manufacturing technique enables 10,000 chips to be packaged on each panel.

It will be appreciated, however, that not all the blocks of the panel need to have chip sockets of the same size. Furthermore, not only may one or more blocks be used for a different sized socket for receiving a different sized chip, but any sub array of any size may be used to fabricate any specific die package, so despite the large throughputs, small runs of small numbers of die packages may be fabricated, enabling different die packages to be simultaneously processed for a specific customer, or different packages to be fabricated for different customers. Thus a panel may comprise at least one region having sockets with a first set of dimensions for receiving one type of chip, and a second region having sockets with a second set of dimensions for receiving a second type of chip. Furthermore, arrays of chips on one or more wafers may be positioned in wafer sized sockets in such panels and the chips may be subsequently packaged prior to the wafer being segmented.

As shown in FIG. 3(a), each chip socket 4 is surrounded by a polymer frame 6. The grid of chip sockets 4 is placed on a tape 30—step 3(b) FIG. 3(b). Chips 10 are placed face down (flip chip) in the sockets 4 of the frame 6 step 3(c) FIG. 3(c) such that the aluminum contacts 12 in passivation layer 14 (see FIGS. 1 and 2) are in contact with the tape 30.

A dielectric material 16, typically a polymer film or a fiber in polymer pre-preg is laminated over the dies 10 and the grid 6—step 3(d) FIG. 3(d).

A carrier 32 is now applied over the dielectric 16, step—3(e) FIG. 3(e). The tape 30 is now removed—step 3(f), FIG. 3(f), exposing the chip contacts 12. An adhesion layer 34 comprising at least one of titanium, tantalum, tungsten, chrome and/or nickel is deposited on the newly exposed surface, followed by a seed layer of copper—step 3(g) FIG. 3(g). Physical vapor deposition (PVD) is typically used. The choice of adhesion metal 34 depends on the polymer 6 and passivation layer 14. Typical combinations for the adhesion layers 34 are Ti/Cu, Ti/W/Cu, Ti/Ta/Cu and Cr/Cu having a thickness range of 0.05 microns to 1 micron.

A layer of photoresist 36 is applied and patterned to form a feature layer—step 3(h), FIG. 3(h). Copper is then electroplated into the pattern to form features 18—step 3(i), FIG. 3(i). Typically the features 18 are in the range of from 1 micron to 25 microns thick. The features 18 may fan out from the die, or may fan inwards. Some features may fan outwards and some may fan inwards. When processing a chip array on a wafer, fan out configurations are generally not possible.

The photoresist 36 is stripped away—step 3(j), FIG. 3(j), and a second layer of photoresist 38 is applied and patterned with via pillars—step 3(k), FIG. 3(k). Copper is electroplated into the pattern to form a layer of via pillars 20, 22, 24—step 3(l), FIG. 3(l). Typically the via pillars 20 are in the range of from 15 microns to 50 microns long.

The second layer of photoresist 38 is striped away—step 3(*m*), FIG. 3(*m*), and the sputtered adhesion layer 34 of one or more of Ti, Ta, Ni, Cr, W, together with the copper seed layer is then etched away 3(*n*).

A dielectric barrier layer 26 is then applied to cover the copper features 18 and pillars 20, 22, 24 and the underside of the chips 10—step 3(*o*), FIG. 3(*o*).

Next, the carrier 32 is removed. Typically, the carrier is copper and is simply etched away. It may be two layer copper carrier, comprising a thin layer peelably attached to a thicker layer in which case the thicker layer is peeled off and the thinner layer is etched away—step 3(*p*), FIG. 3(*p*).

The polymer may be thinned by polising, grinding or by chemical mechanical polishing CMP—step 3(*q*) to expose the frame.

At this stage, a thin layer of black dielectric 28 (film or pre-preg) may be laminated over the back of array of dies 10 and the frame 6—step 3(*r*), FIG. 3(*r*).

The photoresist or other polymer dielectric 26 is thinned to expose the copper pillars 20, 22, 24—step 3(*s*), FIG. 3(*s*).

Terminations 30 are applied 24—step 3(*t*), FIG. 3(*t*) and the array is segmented (diced) into individual packaged chips 8—step 3(*u*), FIG. 3(*u*).

As shown in FIG. 3(*u*) and FIG. 1, the copper pillars 20, 22, 24 comprise a Grid Array of pads that serve as contact in the form of LGA (Land Grid Array) and the top surface of the copper pillars 20, 22, 24 which may be flush with the dielectric 26 thereabound (Fig. u) or may protrude for up to about 10 microns beyond the surface of the dielectric (FIG. 1) are plated with a final metal plating on their external surface comprising Electroless Nickel/Electroless Palladium/Immersion Gold (ENEPIG) or Electroless Nickel/Immersion Gold (ENIG) or Electrolytic Nickel and Gold (Ni/Au) termination techniques. In land grid array structures, the pillars 20, 22, 24 may be square or rectangular.

Thus a method of fabricating the structure of FIG. 1 has been shown. Characteristically, the chip package may include 2 or 3 different dielectrics, with the frame 6, the filler 16 being the same or different polymers or fiber reinforced polymers, and the dielectric surrounding the pillars 26 being a third dielectric.

It will be appreciated that the structure shown in FIG. 3(*u*) as resulting from the method of FIG. 3, may be modified such that the layer of Cu pillars comprises a Grid Array of pads that serve as contact in the form of BGA (Ball Grid Array). In such embodiments, as shown in FIG. 2, the outer surface of the Cu pillars 120 122, 124, may be flush with the surrounding dielectric 126, or may be recessed by as much as 10 microns from the surface of the surrounding dielectric 126. Pillars for BGA are typically cylindrical with round ends for ease of wetting by the solder balls.

When configured as a ball grid array, the ends of the pillars are typically coated with OSP 130 (Organic Solderability Preservative).

Persons skilled in the art will appreciate that the present invention is not limited to what has been particularly shown and described hereinabove. Rather the scope of the present invention is defined by the appended claims and includes both combinations and sub combinations of the various features described hereinabove as well as variations and modifications thereof, which would occur to persons skilled in the art upon reading the foregoing description.

In the claims, the word "comprise", and variations thereof such as "comprises", "comprising" and the like indicate that the components listed are included, but not generally to the exclusion of other components.

What is claimed is:

1. An embedded die package comprising:
   a die having die contact pads in a passivation layer;
   the die contact pads being coupled to a first side of a feature layer by an adhesion/barrier layer, and
   a layer of pillars extending from a second side of the feature layer;
   wherein the die, feature layer and the layer of pillars are encapsulated by a plurality of dielectric materials and said die and said layer of pillars are embedded in different polymer dielectric materials.

2. The embedded die package of claim 1 wherein the die contact pads comprise aluminum.

3. The embedded die package of claim 1 wherein the passivation layer comprises either PI or SiN.

4. The embedded die package of claim 1 wherein the adhesion/barrier layer is selected from the group consisting of Ti/Cu, Ti/W/Cu, Ti/Ta/Cu, Cr/Cu and Ni/Cr.

5. The embedded die package of claim 4 wherein the adhesion/barrier layer has a thickness in the range of from 0.05 microns to 1 microns.

6. The embedded die package of claim 1 wherein the feature layer comprises copper.

7. The embedded die package of claim 6 wherein the feature layer has a thickness in the range of from 1 micron to 25 micron.

8. The embedded die package of claim 6 wherein the layer of pillars has a height in the range of 15 microns to 50 microns.

9. The embedded die package of claim 1 wherein the feature layer has a fan-out form.

10. The embedded die package of claim 1 wherein the feature layer has a fan-in form.

11. The embedded die package of claim 1 wherein said layer of pillars comprises a grid array of pads that serve as contacts for coupling the die to a substrate.

12. The embedded die package of claim 11 wherein the substrate is a PCB.

13. The embedded die package of claim 11 wherein the substrate is a Package for fabricating a Package on Package.

14. The embedded die package of claim 11 wherein the grid array of pads extends up to 10 microns beyond dielectric or are flush with the dielectric thereby providing LGA pads.

15. The embedded die package of claim 14 wherein the grid array of pads are terminated with a termination selected from the group consisting of Electrolytic Ni/Au, ENIG or ENEIG.

16. The embedded die package of claim 11 wherein the grid array of pads is recessed below the dielectric by up to 10 microns, or are flush with the dielectric, thereby providing BGA pads.

17. The embedded die package of claim 16 wherein the grid array of pads are terminated with an Organic Solderability Preservative OSP.

18. A method of fabricating embedded die packages comprising a die having die contact pads in a passivation layer; the die contact pads being coupled to a first side of a feature layer by an adhesion/barrier layer, and
   a layer of pillars extending from a second side of the feature layer; wherein the die, feature layer and the layer of pillars are encapsulated by a plurality of dielectric materials and said die and said layer of pillars are embedded in different polymer dielectric materials, comprising the steps of:
   Obtaining a grid of sockets surrounded by a polymer frame;
   Placing the grid of chip sockets on a tape;

Placing chips face down (flip chip) in the sockets of the grid;
Laminating a dielectric material over the dies and the grid;
Applying a carrier over the dielectric;
Depositing an adhesion/barrier layer comprising at least one of titanium, tantalum, tungsten, chrome and/or nickel followed by a seed layer of copper onto newly exposed surface;
Applying a layer of first layer of photoresist and develop a pattern with a feature layer;
Electroplating copper into the pattern to faint features;
Stripping away the first layer of photoresist;
Applying a second layer of photoresist patterned with a pattern of via pillars;
Electroplating copper into the pattern to form via pillars;
Stripping away the second layer of photoresist;
Etching away exposed portions of the adhesive layer and the copper seed layer;
Applying a dielectric barrier layer covering the copper features, pillars and undersides of the chips;
Removing carrier;
Laminating a thin layer of black dielectric over the back of the array of dies;
Thinning the dielectric to expose the copper pillars;
Applying terminations, and
Dicing the grid into the embedded die packages.

19. The method of claim 18 followed by the additional step of laser marking the black dielectric.

20. The method of claim 18 wherein an array of chips is positioned within each socket.

21. The method of claim 18 wherein a wafer with an array of chips thereon is positioned within each socket.

22. The method of claim 18 wherein the copper pillars comprise a LGA (Land Grid Array) and are characterized by at least one of the following limitations:
Square or rectangular shape;
Outer surface being plated with a final metal plating comprising Electroless Nickel/Electroless Palladium/Immersion Gold (ENEPIG), Electroless Nickel/Immersion Gold (ENIG) or Electrolytic Nickel and Gold (Ni/Au) termination techniques, and
Optionally protruding by up to 10 microns from the surrounding dielectric.

23. The method of claim 18 wherein the copper pillars comprise a BGA (Ball Grid Array) of pads characterized by at least one of:
Being recessed by up to 10 microns with respect to surrounding dielectric;
Having cylindrical shape with circular ends for ease of wetting by solder balls; an
Being coated and OSP (Organic Solderability Preservative).

* * * * *